(12) United States Patent
Bettinelli et al.

(10) Patent No.: US 8,723,023 B2
(45) Date of Patent: May 13, 2014

(54) PHOTOVOLTAIC DEVICE WITH A DISCONTINUOUS INTERDIGITATED HETEROJUNCTION STRUCTURE

(75) Inventors: Armand Bettinelli, Coublevie (FR); Thibaut Desrues, Le Bourget du Lac (FR)

(73) Assignee: Commissariat a l'Energie Atomique, Paris (FR)

( * ) Notice: Subject to any disclaimer, the term of this patent is extended or adjusted under 35 U.S.C. 154(b) by 645 days.

(21) Appl. No.: 12/532,089

(22) PCT Filed: Mar. 26, 2008

(86) PCT No.: PCT/EP2008/053562
§ 371 (c)(1),
(2), (4) Date: Sep. 18, 2009

(87) PCT Pub. No.: WO2008/125446
PCT Pub. Date: Oct. 23, 2008

(65) Prior Publication Data
US 2010/0032014 A1 Feb. 11, 2010

(30) Foreign Application Priority Data
Mar. 28, 2007 (FR) ...................................... 07 54107

(51) Int. Cl.
*H01L 31/00* (2006.01)
(52) U.S. Cl.
USPC .......................................... 136/258; 136/256
(58) Field of Classification Search
USPC .......... 136/252, 243, 256, 258, 261, 264, 265
See application file for complete search history.

(56) References Cited

U.S. PATENT DOCUMENTS 6,187,150 B1 * 2/2001 Yoshimi et al. .......... 204/192.29
2008/0076240 A1 3/2008 Veschetti et al.

FOREIGN PATENT DOCUMENTS

| EP | 1519422 A2 | 3/2005 | |
| JP | 63287077 A | 11/1988 | |
| JP | 2005101240 A | 4/2005 | |
| WO | WO 03/083955 * | 10/2003 | ............ H01L 31/068 |
| WO | WO 03/083955 A1 | 10/2003 | |

OTHER PUBLICATIONS

Harrington, Roger F. et al., Theory of Characteristics Modes for Conducting Bodies, IEEE Transactions on Antennas and Propagation, vol. AP-19, No. 5, Sep. 1971.
International Search Report, PCT/EP2008/053562 dated Jan. 28, 2010.
Japanese Office Action in Application No. 2010-500257, mailed on Sep. 25, 2012.

* cited by examiner

*Primary Examiner* — Alexander Kollias
(74) *Attorney, Agent, or Firm* — Nixon Peabody LLP

(57) ABSTRACT

A photovoltaic device which includes: a) a substrate based on a crystalline semi-conductor material; b) a first electrode which includes at least one heterojunction made on one face, referred to as the rear face, of the substrate, where this heterojunction includes a layer based on a doped amorphous semi-conductor material; and c) a second electrode. The first and second electrodes are arranged on the rear face of the substrate according to an interdigitated combs design, and where the layer includes multiple portions of the doped amorphous semi-conductor material which are unconnected and spaced apart from each other.

19 Claims, 6 Drawing Sheets

PHOTOVOLTAIC DEVICE WITH A DISCONTINUOUS INTERDIGITATED HETEROJUNCTION STRUCTURE

CROSS REFERENCE TO RELATED APPLICATIONS OR PRIORITY CLAIM

This application is a national phase of International Application No. PCT/EP2008/053562, entitled "PHOTOVOLTAIC DEVICE WITH DISCONTINUOUS INTERDIGITED HETEROJUNCTION STRUCTURE", which was filed on Mar. 26, 2008, and which claims priority of French Patent Application No. 07 54107, filed Mar. 28, 2007.

DESCRIPTION

Technical Field and Prior Art

The invention relates to the construction of photovoltaic cells or solar cells, and more specifically to photovoltaic cells with heterojunctions and a discontinuous interdigitated structure.

A conventional photovoltaic cell based on crystalline silicon involves a homojunction structure together with contacts on the front and rear faces of the cell. The conversion efficiency of such a cell is generally between about 14% and 18%. Two other types of more complex photovoltaic cell structures allow conversion efficiencies of over 20% to be obtained: these are photovoltaic rear-contacted cells (RCC) and hetero-junction (HJ) photovoltaic cells.

In the case of RCC photovoltaic cells, N and P doped zones and the metallization associated with these zones, which form an electrode referred to as an emitter and a rear field electrode, are placed on the same side of a substrate (the rear face of the cell, that is, the face opposite that which receives the light radiation) of this cell, in the form of interdigitated combs.

The term comb, both here and in the rest of the document, refers to a design which is made up of several fingers, or portions with an elongated shape (rectangles for example) which are approximately parallel to each other and connected together at one of their sides by a finger arranged perpendicularly to the other fingers. Similarly, the term interdigitated combs, both here and in the rest of the document, refers to two combs as described above, arranged opposite each other and where the fingers of one are arranged between the fingers of the other. The doped zone which forms the emitter is continuous over the entire length of a cell (for example more than 100 mm) and its width is generally between 1 mm and a few hundred microns. Furthermore, the widths of the N and P doped zones are different. The technologies used to make such a cell are similar to those used to make a conventional photovoltaic cell. Additional masking and lithographic steps are however necessary to make localised doping (N and P zones on the same face).

HJ photovoltaic cells make use of completely different technologies: thin layers of doped and un-doped amorphous silicon must first of all be deposited using CVD (chemical vapour deposition) and, for example, by PECVD (plasma enhanced chemical vapour deposition) onto the crystalline substrate of such a cell, then conductive thin layers must be subsequently deposited using PVD (physical vapour deposition). These depositions are made over the entire surface of the solar cell.

The combination of these two structures in order to achieve a rear contacted photovoltaic cell with heterojunctions (HJ+RCC) requires the realization of several thin layers in a localised manner, in particular layers of doped amorphous silicon and thin conductive layers.

FIG. 1 is a view of a rear face of an HJ+RCC photovoltaic cell 1. This cell 1 includes a substrate onto which is deposited, on the rear face of this substrate, a thin layer of non-doped amorphous silicon 2, a thin layer of amorphous silicon which forms N+ doped zones 4 and a thin layer of amorphous silicon which forms P+ doped zones 6, where these doped zones 4 and 6 are arranged in the form of interdigitated combs. These doped zones 4 and 6 are covered by ITO (indium tin oxide). Finally, this structure includes metallizations 8 and 10 which are made on the ITO to make contact with the doped zones 4 and 6.

The construction of such a cell requires the use of restrictive and costly masking and photolithographic steps in order to produce these doped layers 4 and 6 in the form of interdigitated combs, where each doped zone 4 and 6 is continuous, that is, formed by a single element, as in the case of RCC cells.

Presentation of the Invention

One aim of the present invention is to propose a new semi-conductor device allowing rear-contacted photovoltaic cells with heterojunctions to be obtained at low cost.

In order to achieve this, the present invention proposes a photovoltaic device which may include:

a substrate based on a crystalline semi-conductor material, at least two heterojunctions made on one face, referred to as the rear face, of the substrate and which may include a first layer based on an amorphous semi-conductor material doped with a first type of conductivity and a second layer based on an amorphous semi-conductor material doped with a second type of conductivity, where the first and second layers may be arranged on the rear face of the substrate according to an interdigitated combs design, where at least one of the first or second layers may include multiple portions, or contacts, made of the amorphous semi-conductor material doped with the first or second type of conductivity, which are distinct, or unconnected, and spaced apart from each other.

The present invention also relates to a photovoltaic device which includes:

a substrate based on a crystalline semi-conductor material, a first electrode which includes at least one heterojunction made on one face, referred to as the rear face, of the substrate, where this heterojunction includes a layer based on a doped amorphous semi-conductor material, a second electrode, where the first and second electrodes are arranged on the rear face of the substrate according to an interdigitated combs design, and where the layer includes multiple portions of the doped amorphous semi-conductor material which are distinct, or unconnected, and spaced apart from each other.

The device according to the invention means that a photovoltaic cell can be obtained with heterojunctions and rear contacts whose manufacturing costs are lower in comparison with photo-voltaic cells using existing technologies, by avoiding the use of costly masking and photolithographic steps.

The first electrode may form an emitter for the photovoltaic device.

In one variant, the device may include in addition at least one intrinsic amorphous semi-conductor based layer arranged between the substrate and the doped amorphous semi-conductor layer, where the second electrode may include at least one metallization made on the intrinsic amorphous semi-conductor based layer.

The first electrode layer, referred to as the first layer, may be based on an amorphous semi-conductor material doped with a first type of conductivity, and the second electrode may include at least one heterojunction which includes a second layer based on an amorphous semi-conductor material doped with a second type of conductivity.

In this case, the device may in addition include at least one intrinsic amorphous semi-conductor based layer arranged between the substrate and the first and second doped amorphous semi-conductor layers.

The second layer may include multiple portions of the semi-conductor material doped with the second type of conductivity which are distinct, or unconnected, and spaced apart from each other.

The portions of the doped amorphous semi-conductor material may be of an approximately rectangular shape, where the length and width dimensions of the portions of semi-conductor material doped with the first type of conductivity may be different to those of the portions of semi-conductor material doped with the second type of conductivity.

The portions of amorphous semi-conductor material doped with a given type of conductivity may be insulated from each other by portions of insulating material arranged at least between said portions of doped amorphous semi-conductor material and possibly partially arranged on the portions of doped amorphous semi-conductor material, and/or be electrically connected together by metallizations made on said portions of doped amorphous semi-conductor material.

The metallizations made on the portions of amorphous semi-conductor material doped with a given type of conductivity may be formed by a continuous portions based on a conductive material or may include portions of a conductive material which are distinct, or unconnected, and spaced apart from each other.

The device may include in addition at least one layer based on at least one conductive material, for example a conductive transparent oxide such as ITO, and/or a metal, arranged between the portions of doped amorphous semi-conductor material and the metallizations, and which may include portions of the conductive material which are distinct, or unconnected, and spaced apart from each other, whose shape is approximately similar to that of the portions of doped amorphous semi-conductor material, and approximately arranged at the location of the portions of doped amorphous semi-conductor material.

The device may in addition include at least one intrinsic amorphous semi-conductor based layer arranged between the substrate and the first and second doped amorphous semi-conductor layers.

The device may be a photovoltaic cell with heterojunctions and rear contacts.

One aim of the present invention is also to propose a method allowing the cost of producing a solar cell with heterojunctions and rear contacts to be reduced.

In order to do this, the invention also proposes a method of producing a structure with heterojunctions and rear contacts which is not made up of long continuous doped zones, but of short discontinuous doped zones, where electrical continuity of these aligned zones with the same polarity is only achieved at the end of the method, during the deposition of a conductive material which forms the metallizations for the structure.

The present invention also relates to a method of producing a photovoltaic device which may at least include steps for:

the deposition, on a face referred to as the rear face of a crystalline semi-conductor material based substrate, of a first layer based on an amorphous semi-conductor material doped with a first type of conductivity, through a first mask whose design may include discontinuous openings, which may form multiple portions of the amorphous semi-conductor material doped with the first type of conductivity which are distinct, or unconnected, and spaced apart from each other, realization of a second layer based on an amorphous semi-conductor material doped with a second type of conductivity on the rear face of the substrate.

where the first and second layers may be arranged according to an interdigitated combs design, and may form two heterojunctions.

The present invention also relates to a method of producing a photovoltaic device, including at least steps for:

realization of a first electrode which includes at least one step for deposition, onto a face referred to as the rear face of a crystalline semi-conductor material based substrate, of a doped amorphous semi-conductor material based layer, through a mask whose design includes discontinuous openings, which form multiple portions of the doped amorphous semi-conductor material which are distinct, or unconnected, and spaced apart from each other.

realization of a second electrode, where the first and second electrodes are arranged on the rear face of the substrate according to an interdigitated combs design.

Thus the cost of obtaining localised thin layers in rear-contacted solar cells with heterojunctions is reduced by means of steps of deposition through masks which include discontinuous openings, thus replacing costly lithography steps.

The method may include in addition, before the realization of the first electrode, a step for the deposition of an intrinsic amorphous semi-conductor material based layer on the rear face of the substrate, where the doped amorphous semi-conductor material based layer may be deposited on the intrinsic amorphous semi-conductor layer, the realization of the second electrode including a step for the deposition of at least one metallization on the intrinsic amorphous semi-conductor layer.

The layer, referred to as the first layer, may be based on an amorphous semi-conductor material doped with a first type of conductivity, where the realization of the second electrode may include a step for the deposition of a second layer based on an amorphous semi-conductor material doped with a second type of conductivity on the rear face of the substrate.

The method may in addition include, before the realization of the first electrode, a step for the deposition of an intrinsic amorphous semi-conductor based layer on the rear face of the substrate.

The deposition of the second layer based on an amorphous semi-conductor material doped with a second type of conductivity may be achieved through the deposition of the amorphous semi-conductor material doped with a second type of conductivity through a second mask whose design includes discontinuous openings, which may form several portions of the amorphous semi-conductor material doped with the second type of conductivity which are distinct, or unconnected, and spaced apart from each other.

The method may include in addition, once the first and/or second electrode have been made, a step for the deposition, at least between the portions of amorphous semi-conductor material doped with a given type of conductivity, through a mask whose design includes discontinuous openings, of an insulating material and/or partially on the portions of doped semi-conductor material.

In one variant, the method may include in addition, before the first electrode has been made, a step for the deposition of an insulating material through a mask whose design includes discontinuous openings, intended to form portions of insulating material at least between said portions of amorphous material doped with a given type of conductivity.

The method may include in addition, once the first and/or second electrode has been made, a step for the deposition, onto the portions of amorphous semi-conductor material doped with a given type of conductivity, through a mask whose design includes discontinuous openings, of portions of at least one conductive material, for example metal and/or conductive transparent oxide such as ITO.

These portions of conductive material may be deposited on the portions of doped amorphous semi-conductor material through the mask used for the deposition of the layer of doped amorphous semi-conductor material for the first electrode, and when the second electrode includes a second layer of amorphous semi-conductor material doped with the second type of conductivity deposited through the second mask, the portions of conductive material may be deposited on the portions of amorphous semi-conductor material doped with the second type of conductivity through the second mask. Thus the portions of conductive material have a shape and dimensions which are approximately similar to the portions of doped amorphous semi-conductor material.

The method may in addition include, before the deposition of the first layer of amorphous semi-conductor material doped with the first type of conductivity, a step for the deposition of an intrinsic amorphous semi-conductor based layer on the rear surface of the substrate.

The method may also include a step for the realization of metallizations on the portions of doped amorphous semi-conductor material which may electrically connect together the portions of amorphous semi-conductor material doped with a given type of conductivity. This realization of metallizations may be achieved through the deposition of a conductive material through a mask which includes discontinuous openings, forming portions of conductive material which are distinct, or unconnected and spaced apart from each other.

BRIEF DESCRIPTION OF THE DRAWINGS

The present invention will be better understood by reading the description of examples of construction, which are given for purely informative purposes and which are in no way limitative, whilst referring to the appended diagrams in which.

In order to make the figures more readable, the various parts represented in the figures are not necessarily shown on a uniform scale.

The different possibilities (variants and embodiments) must be understood as not being exclusive of each other and may be combined together.

DETAILED DESCRIPTION OF SPECIFIC EMBODIMENTS

Figure 1:
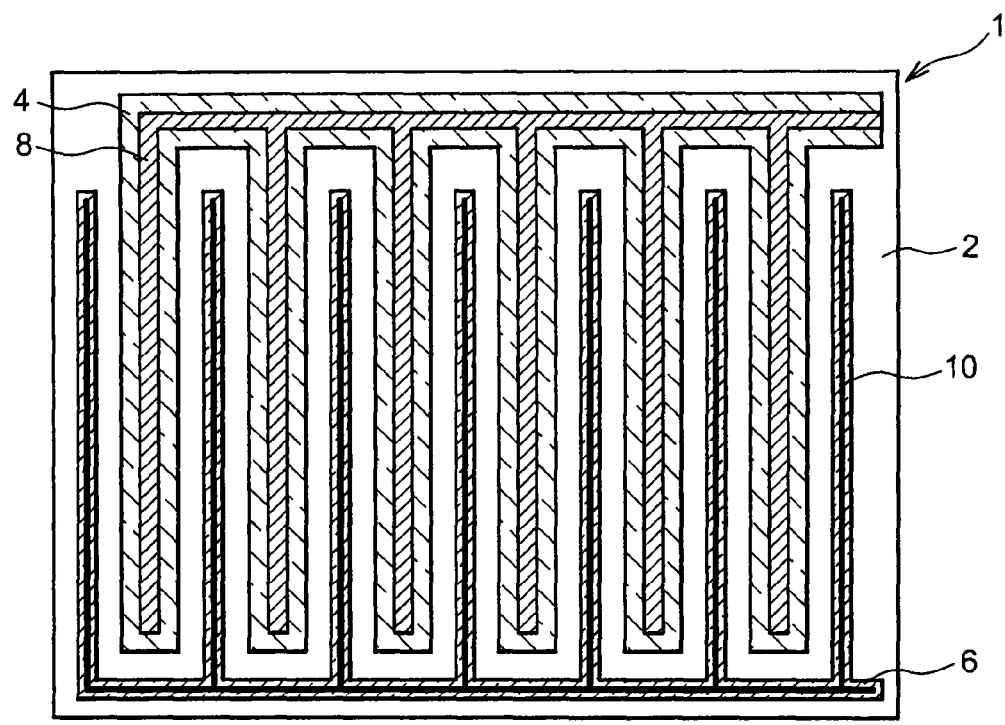
FIG. 1 described previously represents a view from below of a rear-face contacted photovoltaic cell with heterojunctions according to the prior art.
Figure 2:
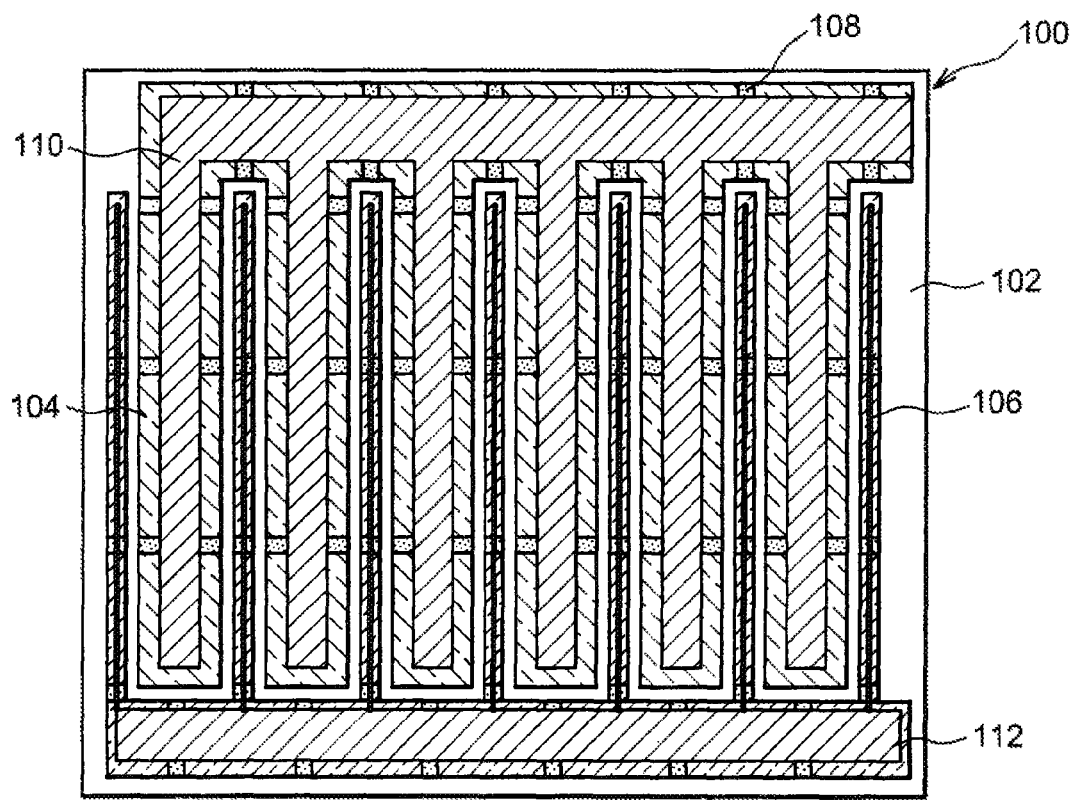
FIG. 2 shows a view from below of a photovoltaic cell with rear-face contacts and heterojunctions, which is the subject of the present invention, according to a first embodiment.

Reference will be made first of all to FIG. 2 which represents a photovoltaic cell with heterojunctions and rear-face contacts according to a first embodiment.

The photovoltaic cell 100 includes a substrate, which cannot be seen in FIG. 2, based on a crystalline semi-conductor, for example silicon. A thin layer 102 of non-doped amorphous semi-conductor, such as silicon, is arranged on a rear face of the substrate. The term thin layer, both here and throughout the rest of the document, refers to a layer whose thickness is, for example, less than or equal to about 10 μm. In this first embodiment, this thin layer 102 has, for example, a thickness equal to about 15 nm. In addition, amorphous materials used in the invention may be purely amorphous materials, but also polymorphous, mono-crystalline or even polycrystalline materials.

The photovoltaic cell 100 includes two amorphous semi-conductor layers, 104 and 106, here made of silicon, doped with two different types of conductivity, N+ and P+ respectively, according to an interdigitated combs design, forming two heterojunctions. Layer 104 forms the emitter electrodes, the layer 106 forming the rear field electrodes. Unlike photovoltaic cells of prior art, the interdigitated combs design formed by these two layers is not continuous, but discontinuous. In effect, each of these layers is made up of portions or contacts which are distinct, or unconnected, to each other. In this example of realization the portions of the N+ doped amorphous silicon layer 104 have an approximately rectangular shape, of width, for example, equal to about 1 mm, of length equal to about 3.5 mm and are spaced apart at a distance equal to about 150 μm. Similarly the portions of the P+ doped amorphous silicon layer 106 also have an approximately rectangular shape, of width equal to about 0.3 mm, of length equal to about 3.5 mm and are spaced apart from each other at a distance equal to about 150 μm.

The spaces, here equal to 150 μm, which separate the portions of the doped amorphous semi-conductor, are here filled in by an insulating material 108, which is, for example, silicon dioxide based. In this first embodiment, the insulating material 108 overflows onto the portions of the doped amorphous silicon layers 104 and 106 therefore partly covering these portions.

A conductive layer, not shown in FIG. 2 for the sake of clarity, is arranged on the portions of doped amorphous silicon formed by the layers 104 and 106. The designs formed by this conductive layer here approximately correspond to the designs formed by the doped layers 104 and 106, but with slightly smaller dimensions (for example smaller by about 0.1 mm). This layer may be based on a conductive material such as a conductive transparent oxide, for example ITO, ZnO, $SnO_2$, $TiO_2$, or a metal, for example silver or aluminium.

Finally, the photovoltaic cell 100 includes metallizations 110 and 112 arranged on the previous conductive layer which is not shown, thus connecting the portions of amorphous silicon doped with a given type of conductivity, by means of this previous conductive layer. In FIG. 2, the metallizations 100 connect the portions of the N+ layer 104, with metallizations 112 connecting the portions of the P+ layer 106. In this figure, for the sake of clarity, the metallizations 110 and 112 are represented as having a width which is less than that of the doped amorphous silicon portions 104 and 106.

Due to the overflow of the insulating material 108 onto the portions of doped amorphous silicon 104 and 106 and due to the fact that the portions of the conductive layer deposited on the portions of doped amorphous silicon and the metallizations 110 and 112 do not have dimensions greater than the portions of doped amorphous silicon, the metallizations 110 and 112 and the conductive layer are not short circuited with the crystalline silicon substrate covered by the thin layer 102.

Reference will now be made to FIGS. 3 to 8B which show the steps of a method of producing a photovoltaic cell 200 with rear-face contacts and heterojunctions.

Figure 3:
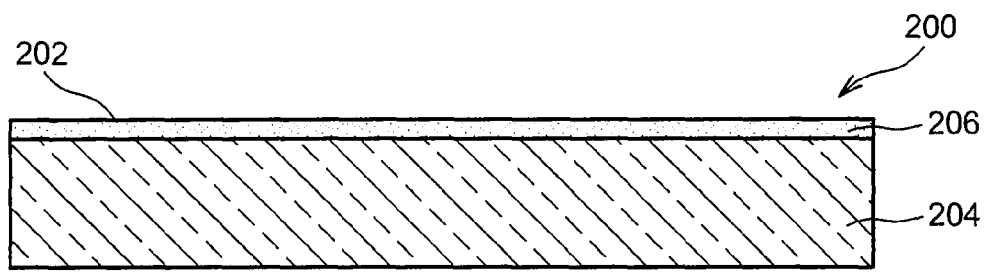
FIGS. 3 to 8B show the steps of a method of producing a photovoltaic cell with rear-face contacts and heterojunctions, which is also the subject of the present invention.

As shown in FIG. 3, a thin layer of amorphous silicon 206, for example similar to the thin layer 102 of the photovoltaic cell 100, is first of all deposited onto a rear face 202 of a substrate 204, for example similar to the substrate of the photovoltaic cell 100.

Figure 4A:
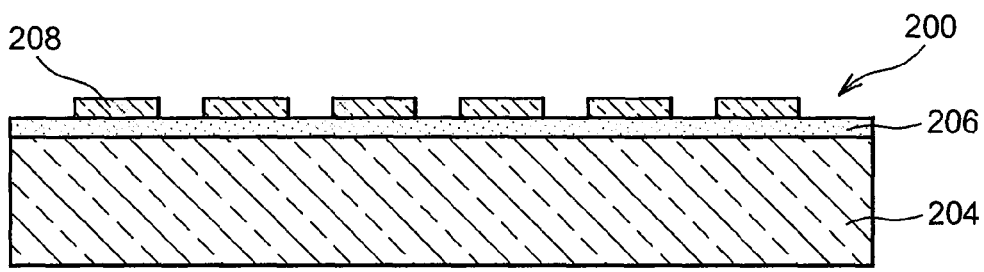
Figure 4B:
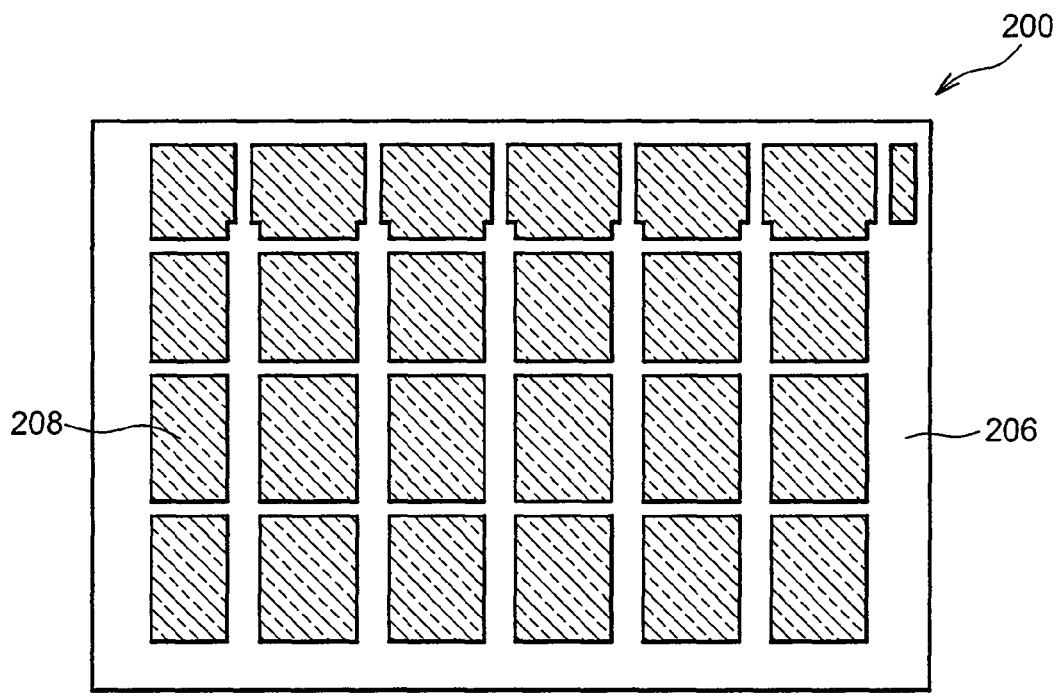

A thin layer of amorphous silicon 208 doped with a first type of conductivity, for example N+, is then deposited through a first mask containing discontinuous openings onto the amorphous layer 206 (FIGS. 4A and 4B). The mask design is then passed onto the layer 208, forming portions of doped amorphous silicon which are distinct, or unconnected, and spaced apart from each other. In this example, the openings of the first mask, and also therefore the portions of doped amorphous silicon made, have an approximately rectangular shape, for example of width equal to about 1 mm and of length equal to about 3.5 mm where these openings are spaced apart from each other at a distance equal to about 150 μm.

Figure 5A:
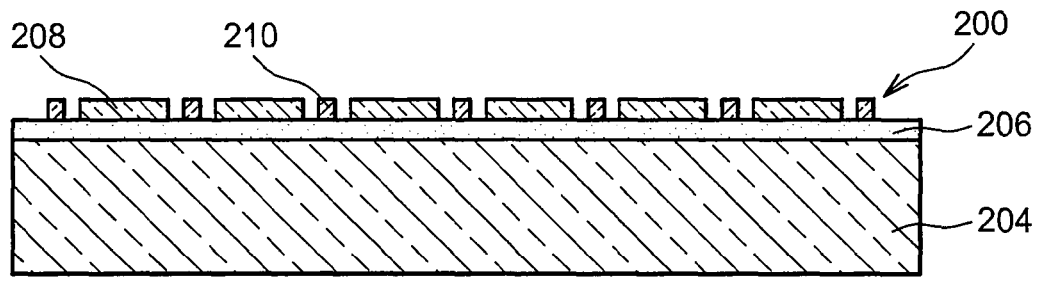
Figure 5B:
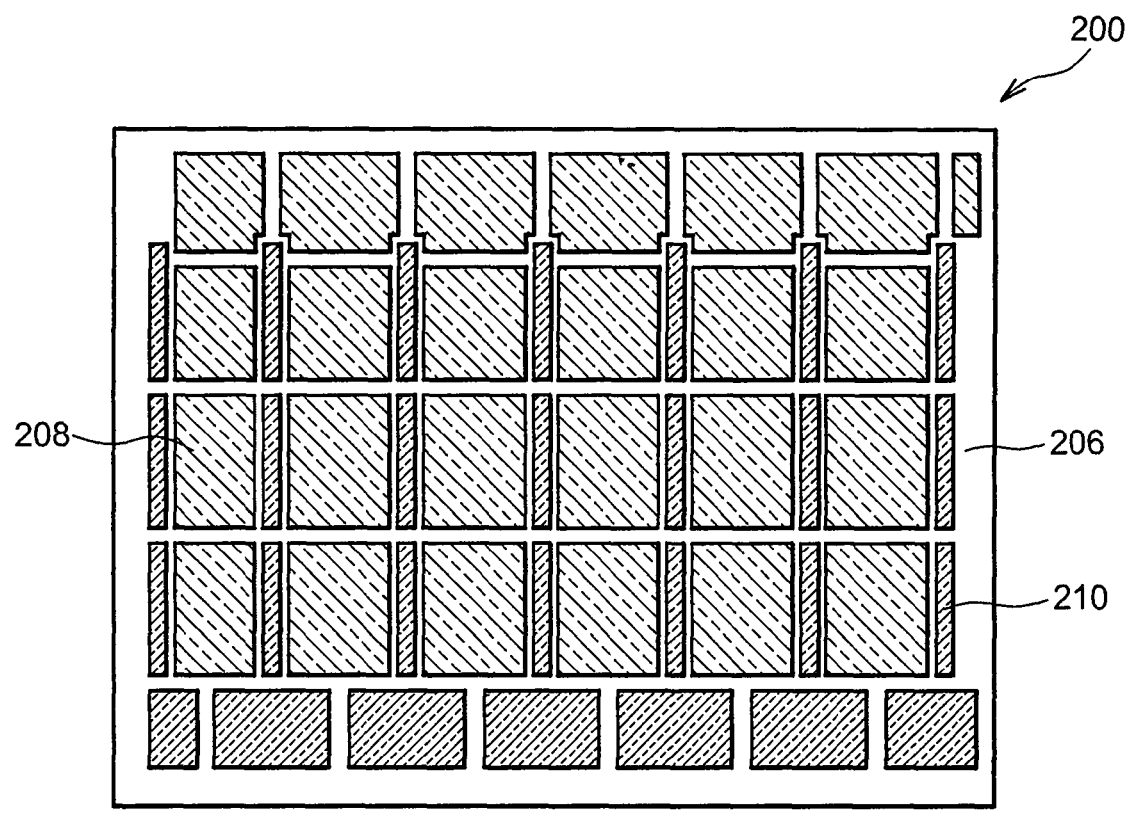

As shown in FIGS. 5A and 5B, a thin layer of amorphous silicon 210 doped with a second type of conductivity, for example P+, is then deposited through a second mask containing discontinuous openings, forming portions of doped amorphous silicon which are distinct, or unconnected, and which are spaced apart from each other. Here the openings of the second mask have a width equal to about 0.3 mm, a length equal to about 3.5 mm and spacing between the openings equal to about 150 μm.

FIG. 5B shows that the thin layers 208 and 210 form an interdigitated combs design. These two layers 208 and 210 form the two heterojunctions of the photovoltaic cell 200. It is possible for the thin layer 210 of P+ doped amorphous silicon to be deposited before the thin layer 208 of N+ doped amorphous silicon.

Figure 6:
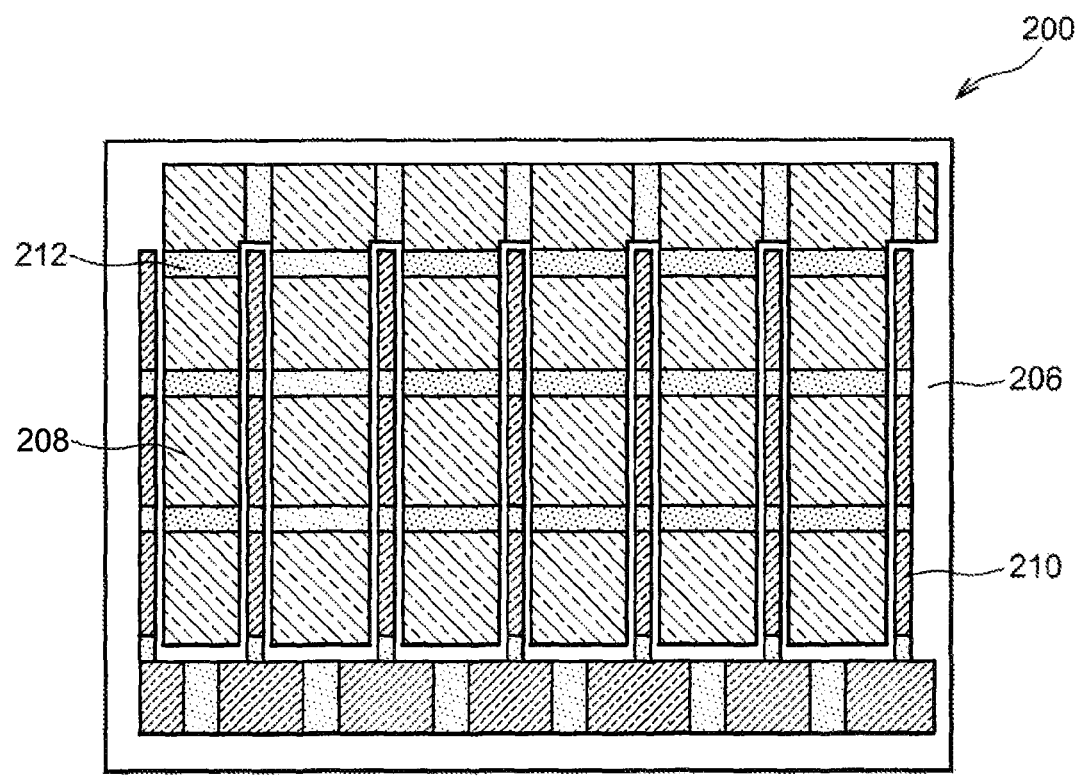
Figure 7A:
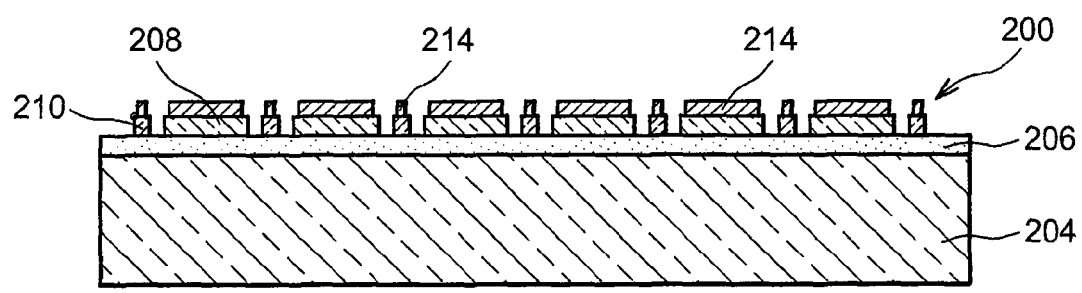
Figure 7B:
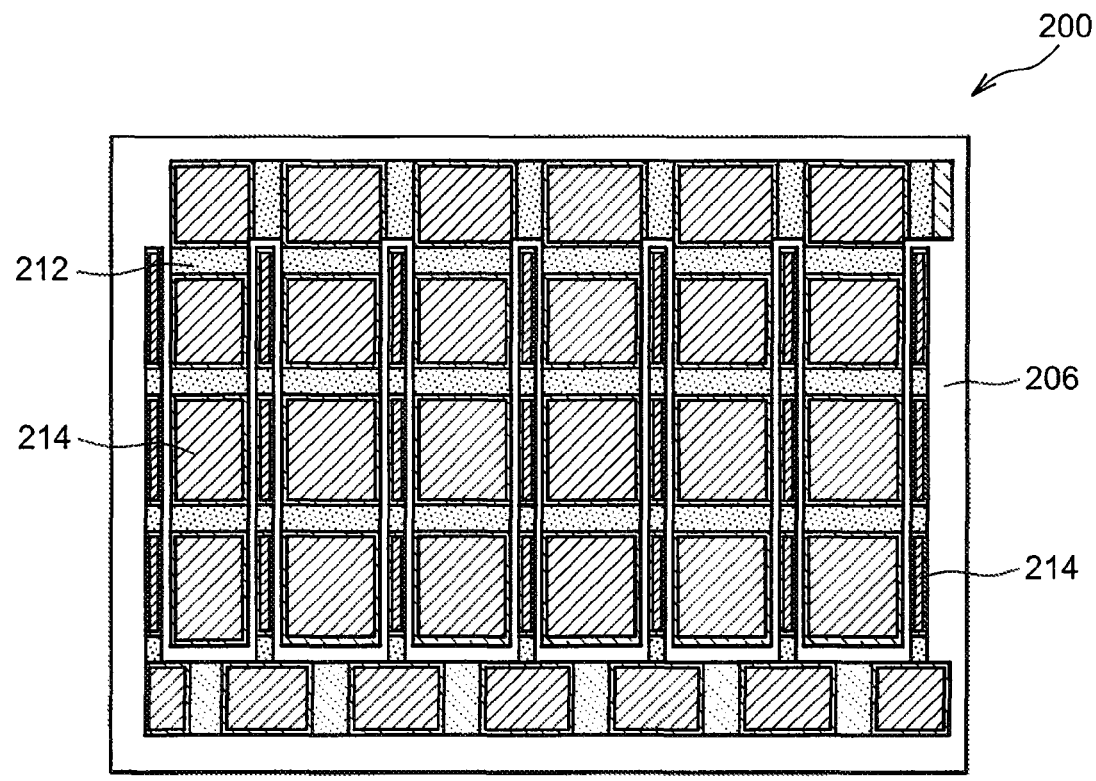

As shown in FIG. 6, a thin insulating layer 212, based for example on silicon dioxide, may be advantageously envisaged: it is deposited at the spaces which separate the portions of the doped amorphous silicon 208 and 210, by means of a third mask which includes discontinuous openings. This insulating layer 212 is made up of multiple portions which have been superimposed at the spaces which separate the portions of the doped layers 208 and 210. Because of a possible offset of the mask and/or of the tolerances in the dimensions of the mask openings and/or overflow during deposition, for example of about +/−50 μm during the realization of layers 208 or 210, the spacing between the portions of the doped layers 208 and 210 is subject to a tolerance double that of the previous dimension, for example about +/−100 μm. In order to ensure that the spaces between the portions are covered by the insulating layer 212, the portions of the insulating layer 212 may be widened in order to incorporate the above stated tolerances. They may have a width equal to, for example, about 350 μm. Thus the ends of the portions of doped layers 208 and 210 are covered by the material of the insulating layer 212, even in the event of any offsetting of the mask during the realization of these doped layers 208 and 210.

In one variant of this method, the insulating layer 212 may be deposited before the deposition of one of the layers of doped amorphous silicon 208 or 210, or before the deposition of the two layers of doped amorphous silicon 208 and 210.

A thin conductive layer 214, for example based on transparent conductive oxide (TCO), such as ITO and/or ZNO and/or SnO2, and/or TiO$_2$, and/or a metal such as silver or aluminium (FIGS. 7A and 7B) is then deposited. This deposition is made through a fourth mask whose openings correspond to those of the first and second mask, but are of slightly smaller dimensions to prevent overflow of the conductive material in relation to the layers of doped amorphous silicon 208 and 210. The conductive material 214 deposited on the portions of the doped layer 208 may form portions with an approximately rectangular shape, for example with a width equal to about 0.9 mm and length equal to about 3.4 mm, where the conductive material 214 deposited on the portions of the doped layer 210 may also form portions which are approximately rectangular in shape, for example with a width equal to about 0.2 mm and a length equal to about 3.4 mm.

Figure 8A:
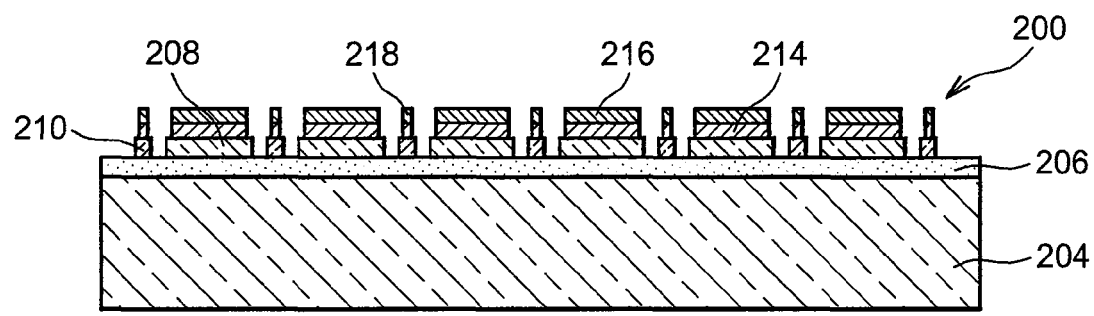
Figure 8B:
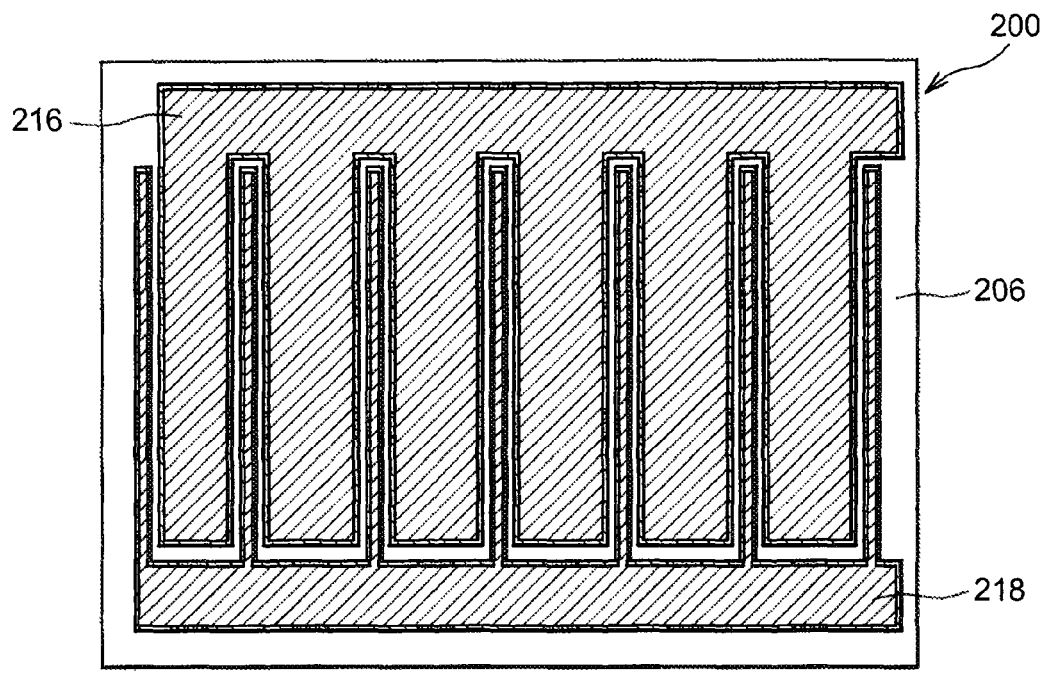

Finally, as shown in FIGS. 8A and 8B, a layer with a thickness, for example, greater than about 10 μm, based on a conductor such as aluminium, which may or may not be different to that of layer 214, is deposited on the conductive material 214 in order to form metallizations of the cell 200. This layer forms metallizations 216 which connect the portions of N+ amorphous silicon 208 to each other and metallizations 218 which connect the portions of P+ amorphous silicon 210 to each other. In FIG. 8B, these metallizations 216 and 218 have a width which is approximately similar to that of the portions of conductive material 214 on which these metallizations occur: for example, the metallizations 216 here have a width equal to about 0.9 mm and metallizations 218 here have a width equal to about 0.2 mm. These metallizations 216, 218 are here made by serigraphy using a low temperature polymer-based paste loaded with silver and/or any other metal suitable for forming metallizations.

In the example described previously, the dimensions given were defined so as to ensure that critical coverings were obtained, by allowing for possible offsetting of about 50 μm relative to the dimensions of deposited designs (offsetting of masks and alignment, burring of the deposit etc.)

For a photovoltaic cell with a format equal to 200×200 mm, the masks used in its realization allow rectangles with dimensions equal to 170×50 μm to be deposited in steps of 200×70 μm without burring, with dynamic alignment carried out using a vision system.

In this method, the deposits of intrinsic and doped amorphous silicon are CVD deposits, for example PECVD or HW-CVD (hot wire chemical vapour deposition). The transparent conductive oxide and metal deposits are PVD deposits, for example by cathodic spraying or evaporation. Finally, the deposits of insulating materials are CVD deposits, for example PECVD.

Figure 9:
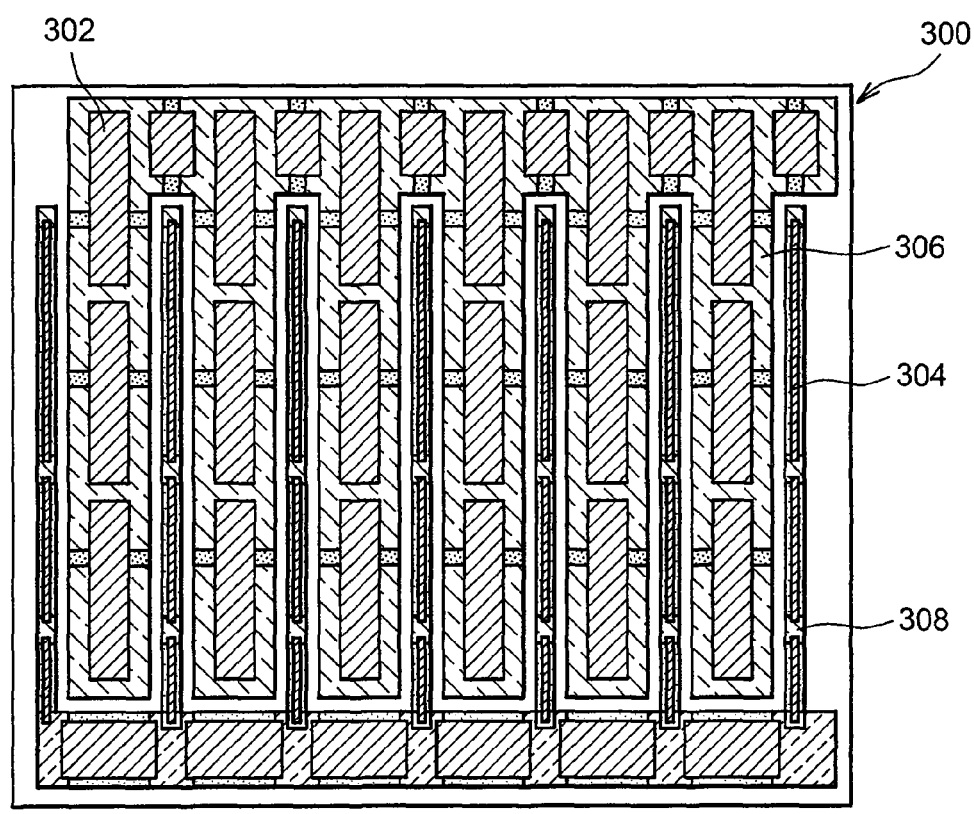
FIG. 9 shows a view from below of a photovoltaic cell with rear-face contacts and heterojunctions, which is the subject of the present invention, according to a second embodiment, Identical, similar or equivalent parts of the various figures described hereafter bear the same numerical references so as to facilitate moving from one figure to another.

Reference will now be made to FIG. 9 which represents a photovoltaic cell 300 with heterojunctions and rear-face contacts according to a second embodiment.

In relation to the first embodiment, the photovoltaic cell 300 includes metallizations 302 and 304 which are not continuous, that is, which include conductive portions, where each of these conductive portions connect two portions of amorphous silicon with the same type of conductivity. These metallizations 302 and 304 are therefore not achieved using serigraphy but by deposition through a mask whose design corresponds to the design of these metallizations 302 and 304.

In this variant a conductive layer 214, not represented in FIG. 9, is advantageously envisaged which is of lower resistivity. In order to achieve this, the thickness of the conductive layer 214 may be increased when it is ITO based, or a metal used which exhibits a lower resistivity than ITO, or an ITO/metal bi-layer (for example 40 nm of ITO and 150 nm of aluminium) used.

In addition, unlike the photovoltaic cell 100 of the first embodiment, the photovoltaic cell 300 includes N+ and P+ doped portions 306 and 308 of amorphous silicon, of different lengths. In FIG. 9, the portions of N+ amorphous silicon 306 have a length which is greater than that of the portions of P+ amorphous silicon 308. Thus the openings in the mask used to make the conductive layer, for example of ITO, deposited on the portions of N+ doped amorphous silicon 306 and those used in the realization of the ITO layer on P+ doped portions of amorphous silicon 308 are not aligned one next to the other; this removes the constraint on the minimum width of the bridge of material which can exist between the openings in the mask. The insulating portions which separate the portions of P+ amorphous silicon 308 are here made as long as possible in order to optimise the passivation at the rear field electrode.

Furthermore, the openings in the mask used for deposition of the insulating layer (for example $SiO_2$) may be elongated so that they also benefit from a lateral overflow, forming, for example, insulating portions whose width is for example equal to about 1.1 mm (deposited on portions of amorphous silicon whose width is for example equal to about 1 mm) or 0.4 mm (deposited on portions of amorphous silicon whose width is equal for example to about 0.3 mm).

In addition, the portions of ITO may be deposited in two steps: a first step which makes the portions of ITO on the portions of N+ doped amorphous silicon, then a second step which makes portions of ITO on portions of P+ doped amorphous silicon. In this case it is also possible for a given mask to be used for the deposition of doped amorphous silicon layers and for the deposition of conductive portions on the portions of doped amorphous silicon layers. In this case deposition of the N+ doped amorphous silicon layer is carried out first of all, then deposition of the conductive portions intended to be placed on the portions of the N+ doped amorphous silicon layer, deposition of the P+ doped amorphous silicon layer, deposition of the conductive portions intended to be arranged on the portions of the P+ doped amorphous silicon layer, deposition of the insulating layer and finally the realization of metallizations.

In general terms, the masks used during the realization of a photovoltaic cell are appropriately pressed against the cell, using a flat mask which is well stretched over a frame, in order to prevent overflow of the material applied through the mask, so as to prevent short-circuiting between the areas of different polarity. The masks used may be metallic masks.

The spacings and coverings for the various layers which avoid short circuits require that tolerances in the geometry of the masks and in the alignments between the deposits be applied. This requires that several conditions are met.

First of all one of the conditions is that there are well defined openings in the mask. In order to achieve this masks are preferably obtained using electro-deposition, which offers excellent geometrical precision, or by chemical or laser trimming. Furthermore, if the mask openings exhibit a degree of conicity (dimensions on one side of the mask slightly greater than on the other) this difference in dimensions is to be taken into consideration when choosing the side of the mask coming into contact with the substrate. Finally using a mask of reduced thickness (for example equal to about 50 μm) means that shading phenomena are reduced. Masks of variable thickness may also be envisaged, with reduced thicknesses around openings relative to the rest of the mask.

Another of these conditions is to ensure good alignment between the various levels of the layers made on the substrate. To achieve this, indexing of the mask relative to the substrate is carried out during the producing method through test patterns included in the masks. These test patterns, or indexing holes, are used either to achieve mechanical positioning of the substrate/mask (or frame) or preferably for dynamic alignment via a vision system. Allowances are also made for the differential expansion phenomena that PECVD and PVD deposits produce in the range 150 to 200° C., in particular by ensuring that masks are made using the same materials.

In the methods described, the masks are designed so that the widths of the material bridges, that is, the dimensions of the material portions of the mask between two openings, is at least equal to the thickness of the mask at this area. The greater the length of these material bridges, the greater the number of bridges per unit length, so as to ensure good mechanical strength of these material bridges.

In the examples described above, both electrodes in the photovoltaic cell are made using unconnected portions of doped amorphous semi-conductor material. In a variant, it is possible for one electrode to be formed in this way. The other electrode may then be formed only of a single conductive track, for example based on a metal such as aluminium, deposited directly on the intrinsic amorphous silicon layer. The electrode made using the unconnected portions of doped amorphous semi-conductor is advantageously the electrode which forms the emitter of the photovoltaic cell.

The invention claimed is:

1. A photovoltaic device comprising:
a substrate based on a crystalline semi-conductor material;
a first electrode which comprises at least one heterojunction made on a rear face of the substrate based on a crystalline semi-conductor material, the at least one heterojunction comprises a layer based on a doped amorphous semi-conductor material; and
a second electrode, wherein the first and second electrodes are arranged on the rear face of the substrate based on a crystalline semi-conductor material;
the first electrode has a first comb pattern where approximately parallel fingers of the first electrode are connected at an end of the first electrode by a first perpendicular finger;
the second electrode has a second comb pattern where approximately parallel fingers of the second electrode are connected at an end of the second electrode by a second perpendicular finger, and wherein;
the first and second electrodes are arranged according to an interdigitated combs design in which fingers of the first comb are interspersed between fingers of the second comb; wherein each one of the approximately parallel fingers of the first electrode comprises segmented portions of the layer of doped amorphous semi-conductor material that are unconnected and spaced apart from each other and wherein each of the approximately parallel fingers of the second electrode comprises segmented portions of the layer doped amorphous semi-conductor material that are unconnected and spaced apart from each other.

2. The photovoltaic device according to claim 1, wherein the first electrode forms an emitter of the photovoltaic device.

3. The photovoltaic device according to claim 1, further comprising at least one intrinsic amorphous semi-conductor based layer arranged between the substrate based on a crystalline semi-conductor material and the layer based on the doped amorphous semi-conductor material.

4. The photovoltaic device according to claim 3, wherein the second electrode includes at least one metallization made on the at least one intrinsic amorphous semi-conductor based layer.

5. The photovoltaic device according to claim 1, wherein at least some of the multiple portions of doped amorphous semi-conductor material are approximately rectangular in shape.

6. The photovoltaic device according to claim 1, wherein the layer based on the amorphous semi-conductor material, is a first layer, and is doped with a first type of conductivity, and wherein the second electrode further comprises at least one heterojunction which comprises a second layer based on an amorphous semi-conductor material doped with a second type of conductivity.

7. The photovoltaic device according to claim 6, further comprising at least one intrinsic amorphous semi-conductor based layer arranged between the substrate based on a crystalline semi-conductor material and the first layer based on doped amorphous semi-conductor material, and between the substrate based on a crystalline semi-conductor material and the second layer based on doped amorphous semi-conductor material.

8. The photovoltaic device according to claim 6, wherein the second layer based on doped amorphous semi-conductor material comprises multiple portions of amorphous semi-conductor material doped with the second type of conductivity which are distinct and spaced apart from each other.

9. The photovoltaic device according to claim 8, wherein at least some of the multiple portions of amorphous semi-conductor material of the second layer based on doped amorphous semi-conductor material are approximately rectangular in shape.

10. The photovoltaic device according to claim 9, wherein length and width dimensions of the approximately rectangular-shaped multiple portions of semi-conductor material doped with the first type of conductivity are different from the multiple portions of amorphous semi-conductor material doped with the second type of conductivity.

11. The photovoltaic device according to claim 6, wherein portions of the amorphous semi-conductor material doped with a first type of conductivity are insulated from each other by portions of insulating material and portions of the amorphous semi-conductor material doped with a second type of conductivity are insulated from each other by portions of insulating material.

12. The photovoltaic device according to claim 11, wherein the insulating material is partially arranged on portions of the amorphous semi-conductor material doped with a first type of conductivity and wherein the insulating material is partially arranged on portions of the amorphous semi-conductor material doped with a second type of conductivity.

13. The photovoltaic device according to claim 1, wherein the segmented portions of doped amorphous semi-conductor material are electrically connected together by metallizations made thereon.

14. The photovoltaic device according to claim 13, wherein the metallizations are formed by a continuous portion based on a conductive material.

15. The photovoltaic device according to claim 13, wherein the metallizations include portions of a conductive material which are distinct and spaced apart from each other.

16. The photovoltaic device according to claim 13, further comprising at least one layer based on at least one conductive material arranged between the segmented portions of doped amorphous semi-conductor material and the metallizations.

17. The photovoltaic device according to claim 16, wherein said conductive material is a conductive transparent oxide, a metal, ITO, or combinations thereof.

18. The photovoltaic device according to claim 16, wherein the at least one layer based on the at least one conductive material comprises portions of conductive material which are distinct and spaced apart from each other, are of a shape approximately similar to that of the segmented portions of doped amorphous semi-conductor material.

19. The photovoltaic device according to claim 1, wherein said photovoltaic device is a photovoltaic cell with heterojunctions and rear-face contacts.

* * * * *

UNITED STATES PATENT AND TRADEMARK OFFICE
CERTIFICATE OF CORRECTION

PATENT NO. : 8,723,023 B2  
APPLICATION NO. : 12/532089  
DATED : May 13, 2014  
INVENTOR(S) : Bettinelli et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 507 days.

Signed and Sealed this

Twenty-ninth Day of September, 2015

Michelle K. Lee
*Director of the United States Patent and Trademark Office*